(12) United States Patent
van Greunen et al.

(10) Patent No.: US 12,272,533 B2
(45) Date of Patent: *Apr. 8, 2025

(54) ASSESSMENT OF MATCHING NETWORKS

(71) Applicant: Advanced Energy Industries, Inc., Fort Collins, CO (US)

(72) Inventors: Corneluis Erasmus van Greunen, Fort Collins, CO (US); Masahiro Watanabe, Windsor, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 407 days.

This patent is subject to a terminal disclaimer.

(21) Appl. No.: 17/132,007

(22) Filed: Dec. 23, 2020

(65) Prior Publication Data

US 2021/0111009 A1 Apr. 15, 2021

Related U.S. Application Data

(63) Continuation of application No. 16/291,122, filed on Mar. 4, 2019, now Pat. No. 10,943,770.

(51) Int. Cl.
*H01J 37/32* (2006.01)
*G01R 31/24* (2020.01)
*H03H 7/40* (2006.01)

(52) U.S. Cl.
CPC ...... *H01J 37/32926* (2013.01); *G01R 31/245* (2013.01); *H01J 37/32183* (2013.01); *H03H 7/40* (2013.01); *H01J 2237/24564* (2013.01)

(58) Field of Classification Search
CPC ........... H01J 37/32926; H01J 37/32183; H01J 2237/24564; G01R 31/245; H03H 7/40

USPC .......................................................... 333/32
See application file for complete search history.

(56) References Cited

U.S. PATENT DOCUMENTS

| | | |
|---|---|---|
| 5,187,454 A | 2/1993 | Collins et al. |
| 6,946,847 B2 | 9/2005 | Nishimori et al. |
| 6,983,215 B2 | 1/2006 | Coumou |
| 7,005,845 B1 | 2/2006 | Gonzalez et al. |
| 9,041,480 B2 | 5/2015 | Radomski |
| 9,306,533 B1 | 4/2016 | Mavretic |

(Continued)

FOREIGN PATENT DOCUMENTS

| | | |
|---|---|---|
| JP | 2003197609 A | 7/2003 |
| JP | 2004-085446 A | 3/2004 |

(Continued)

OTHER PUBLICATIONS

Yasushi Shizuki, Japanese Official Action, Jan. 9, 2024, Japanese Patent Office, Japan.

(Continued)

*Primary Examiner* — Hafizur Rahman
(74) *Attorney, Agent, or Firm* — NOD Law PC

(57) ABSTRACT

Systems and methods for operating a match network are disclosed. One match network comprises at least one first sensor to measure one or more first parameters and at least one second sensor to measure one or more second parameters. The match network also comprises means for assessing whether the match is operating as expected or operating outside of specifications using the one or more first-parameter measurements; the one or more second-parameter measurements; a setting of the match; or one or more expected parameter values.

19 Claims, 9 Drawing Sheets

(56) References Cited

U.S. PATENT DOCUMENTS

| | | | |
|---|---|---|---|
| 9,865,432 B1 | 1/2018 | Bhutta | |
| 10,748,748 B2 * | 8/2020 | Valcore, Jr. | ............... H03J 7/00 |
| 2003/0184319 A1 | 10/2003 | Nishimori et al. | |
| 2004/0060660 A1 | 4/2004 | Klimecky et al. | |
| 2004/0235304 A1 | 11/2004 | Oh | |
| 2014/0028389 A1 | 1/2014 | Coumou | |
| 2014/0172335 A1 * | 6/2014 | Valcore, Jr. | ............ G01R 19/25 |
| | | | 702/65 |
| 2017/0301516 A1 * | 10/2017 | Bhutta | .................... H03H 7/38 |
| 2017/0365907 A1 * | 12/2017 | Kapoor | .................. C23C 16/52 |
| 2019/0288683 A1 | 9/2019 | Morii et al. | |

FOREIGN PATENT DOCUMENTS

| | | |
|---|---|---|
| JP | 2007295447 A | 11/2007 |
| JP | 2015018766 A | 1/2015 |
| JP | 2018082332 A | 5/2018 |

OTHER PUBLICATIONS

Nakamura, Yukari, "International Preliminary Report On Patentability Regarding International Application No. PCT/US2020/020750", Sep. 16, 2021, pp. 6, Published in: CH.

Yogeshwar Ranga, "International Search Report and Written Opinion Regarding International Application No. PCT/US2020/020750", May 29, 2020, pp. 17, Published in: AU.

Rahman, Hafizur, "Office Action Regarding U.S. Appl. No. 16/291,122", Oct. 16, 2020, pp. 27, Published in: US.

KIPO, Office action issued Korean patent application No. 10-2021-7031810, Feb. 18, 2025, 28 pages.

* cited by examiner

FIG. 8: S-Parameter Characterization Data

ASSESSMENT OF MATCHING NETWORKS

CLAIM OF PRIORITY UNDER 35 U.S.C. § 120

The present application for Patent is a Continuation of patent application Ser. No. 16/291,122 entitled "DETECTION OF DAMAGE IN MATCHING NETWORKS" filed Mar. 4, 2019, pending, and assigned to the assignee hereof and hereby expressly incorporated by reference herein.

FIELD OF THE INVENTION

The present invention relates generally to plasma processing. In particular, but not by way of limitation, the present invention relates to systems, methods and apparatuses for impedance-matching radio frequency power transmitted from a radio frequency generator to a plasma load in a semiconductor processing chamber.

BACKGROUND OF THE INVENTION

In the semiconductor manufacturing world, manufacturers produce plasma processing chambers that utilize radio frequency (RF) power to generate a plasma. In order to achieve efficient power transfer between the RF generator ("generator") and the plasma load, an impedance-matching network ("match network") is often used to match the load impedance to a desired input impedance, typically 50 ohms. Plasma load impedance may vary depending on variables such as generator frequency, power, chamber pressure, gas composition, and plasma ignition. The match network accounts for these variations in load impedance by varying reactive elements (e.g., variable capacitors) to maintain the desired input impedance.

Many match networks are operable when there is some damage to the match network and/or when the match network is operating outside of design specifications for the match network. A damaged match network can cause RF power loss, which may result in lower RF power being applied to the process chamber, and a lower application of RF power can result in process shift. In a worst-case scenario, process shift can result in damage to workpieces (e.g., wafers) being processed in the processing chamber without the damage being noticed. As a consequence, detecting damage and/or operational changes to match networks is desirable.

SUMMARY

According to an aspect, a method includes coupling power from a generator to a plasma load through the match network and measuring one or more parameters at a first side of the match network to obtain at least one measurement-based-attribute at the first side of the match network. One or more parameters are also measured at a second side of the match network to obtain at least one measurement-based-attribute at a second side of the match network. Present settings of the match network and obtained and the at least one measurement-based-attribute at the first side of the match network is compared with at least one expected-attribute at the second side of the match network based upon the present settings of the match network. The at least one measurement-based-attribute at the second side of the match network is contrasted with the at least one expected-attribute to assess whether the match network is damaged, operating as expected, operating within specifications, or operating outside of specifications.

Another aspect may be characterized as a match system that comprises at least one first sensor to measure one or more first parameters and at least one second sensor to measure one or more second parameters. The match system also comprises means for assessing whether the match is operating as expected or operating outside of specifications using the one or more first-parameter measurements; the one or more second-parameter measurements; a setting of the match; or one or more expected parameter values.

DETAILED DESCRIPTION

The following modes, features or aspects, given by way of example only, are described in order to provide a more precise understanding of the subject matter of several embodiments.

The word "exemplary" is used herein to mean "serving as an example, instance, or illustration." Any embodiment described herein as "exemplary" is not necessarily to be construed as preferred or advantageous over other embodiments.

Figure 1:
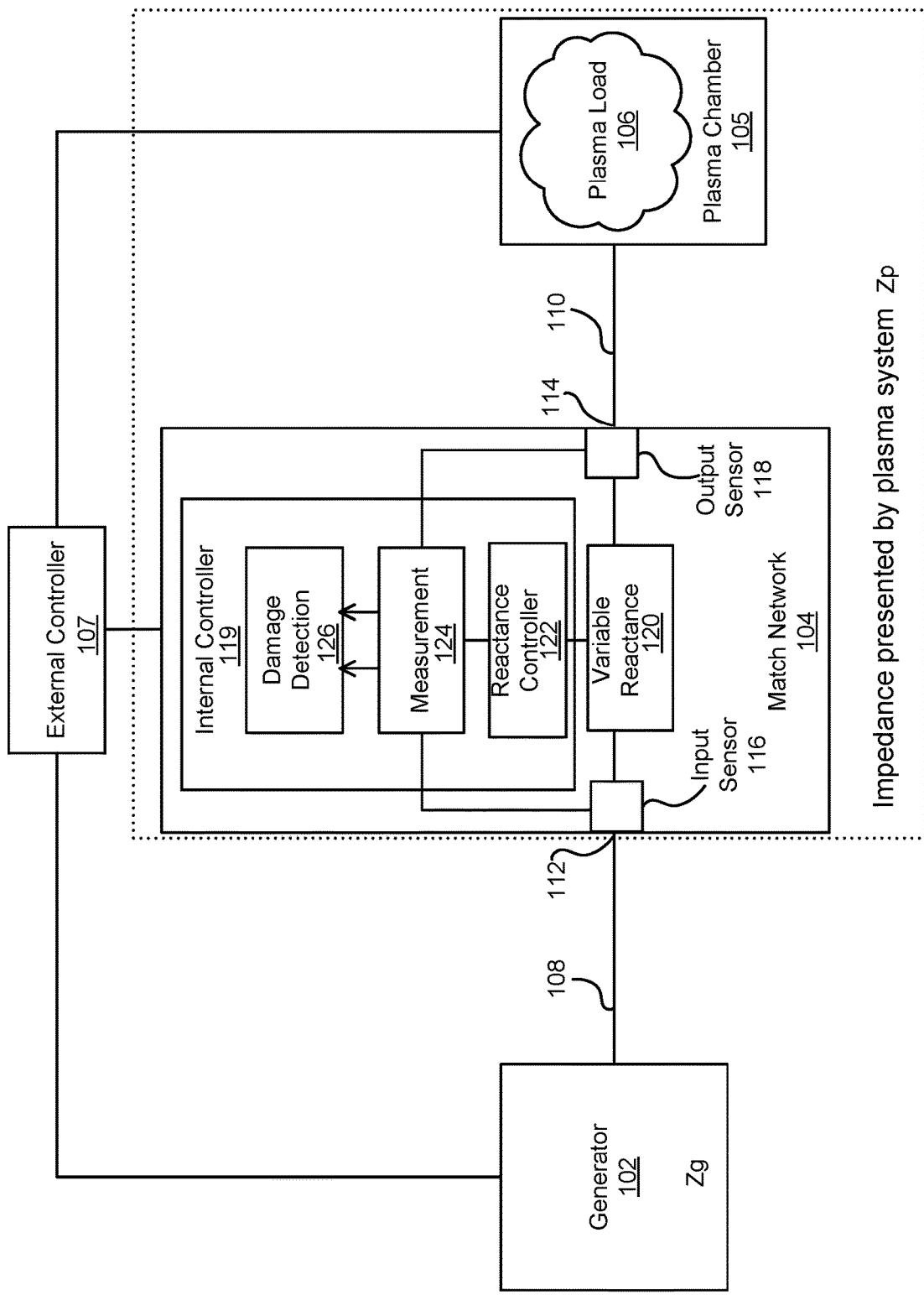
FIG. 1 is a block diagram depicting an environment in which aspects of the present invention may be implemented

Referring first to FIG. 1, shown is a generator 102, match network 104, a plasma processing chamber 105, a plasma load 106, and an external controller 107. In operation, the generator 102 applies power (e.g., RF power) to the match network 104 via a transmission line 108 (e.g., coaxial cable) and then onto the plasma load 106 via an electrical connection 110. The generator 102 may be realized by a variety of different types of generators that may operate at a variety of different power levels and frequencies.

The match network 104 includes an input 112 including an electrical connector (not shown) to couple to the generator 102 via the transmission line 108 and an output 114 including an electrical connector (not shown) to couple to the plasma load 106 via the electrical connection 110. As shown, the match network 104 also includes an input sensor 116 and an output sensor 118 that are both coupled to an internal controller 119, which includes a measurement section 124, a reactance controller 122, and a variable reactance section 120.

The plasma load 106 may be a plasma formed in the plasma processing chamber 105, which is known for performing treatments such as the etching of substrates or the deposition of thin layers upon substrates. The plasma load 106 is typically achieved by the formation of plasmas within low pressure gases. The plasma is initiated and sustained by the generator 102 (and potentially additional generators), and the match network 104 is employed to ensure the generator 102 sees a desired impedance (typically, although not always, 50 ohms) at the output of the generator.

The generator 102 may apply RF power to the plasma load 106 by a conventional 13.56 MHz signal, but other frequencies may also be utilized. The generator 102 may have a source impedance of 50 ohms and an output stage to match the source impedance of the generator 102 to the impedance of the transmission line 108, which may be a typical transmission line (such as a 50 ohm coaxial cable).

The external controller 107 may be realized by hardware or hardware in connection with software, and the external controller 107 may be coupled to several components of a plasma processing system including the generator 102, match network 104, equipment coupled to the plasma chamber 105, other generators, mass flow controllers, etc.

In general, the match network 104 functions to transform an impedance at the output 114 of the match network 104 to an impedance, Zp, that is presented to the transmission line 108 at an input 112 of the match network 104. More specifically, within the match network 104, the variable reactance section 120 functions to transform the impedance at the output 114 of the match network 104 to an input-impedance that is presented to the transmission line 108 at an input of the match network 104. More particularly, as those of ordinary skill in the art will readily appreciate, the measurement section 124 may receive signals from the input sensor 116 that are indicative of electrical parameter values at the input 112 of the match network. In turn, the measurement section 124 may provide one or more processed signals to the reactance controller 122, which controls a setting of the variable reactance section 120, and hence, the internal electrical elements (e.g., variable reactance elements) such that the input impedance of the match network 104 is close to a desired input impedance (e.g., close to 50 ohms).

The reactance controller 122 may implement a conventional feedback loop to control the variable reactance section 120 to minimize reflected RF power, but reflected power need not be minimized, and in some instances, it is desirable to control the variable reactance section 120 based on another parameter (e.g., a reflection coefficient) and/or to minimize instabilities.

The input sensor 116 and/or the output sensor 118 may be realized by a conventional dual directional coupler (known to those of ordinary skill in the art) that includes sensing circuitry that provides outputs indicative of forward and reflected power at the input of the match network 104. The input sensor 116 and/or the output sensor 118 may also be realized by a conventional voltage-current (V/I) sensor (known to those of ordinary skill in the art) that includes sensing circuitry that provides outputs indicative of voltage, current, and a phase between the voltage and current. As an example, a directional coupler may be used to realize the input sensor 116 and a V/I sensor may be used to realize the output sensor 118. Moreover, each of the input and output sensors 116, 118 may be realized by more than one separate sensors (e.g., a separate voltage sensor and a separate current transducer). In other words, although a single block is depicted for each of the input and output sensors 116, 118, the single blocks each represent one or more sensors.

The measurement section 124 may include processing components to sample, filter, and digitize the outputs of the input sensor 116 for utilization by the reactance controller 120. It is also contemplated that signals from the output sensor 118 may be utilized to control the variable reactance section 120. In any event, the reactance controller 122 may adjust the variable reactance component 120 to transform the impedance at the output of the match network 114 to the desired impedance (e.g., 50 ohms) at the input 112 of the match network. Because an impedance of the plasma load 106 tends to vary during processing of a workpiece (e.g., a substrate), the reactance controller 122 may operate to adjust the variable reactance section 120 to change its impedance to compensate for fluctuations in the impedance of the plasma load.

The match network 104 (and many variations of the match network 104) may be operable when there is some damage to the match network and/or when the match network is operating outside of design specifications. As discussed above, a damaged or operationally-deficient match network 104 can cause variations in the power applied to the plasma load 106, which can result in damage to workpieces (e.g., wafers) being processed in the processing chamber without the damage being noticed. As a consequence, aspects disclosed herein address this problem by detecting changes in the match network 104 that are indicative of damage to the match network 104 and/or operation outside of specifications.

More specifically, the match network 104 may include a damage detection component 126 that is coupled to the measurement section 124. In general, the damage detection component 126 is able to assess whether the variable reactance section 120 is at least one of damaged or operating outside of specifications using one or more input-parameter measurements (e.g., from the input sensor 116); one or more output-parameter measurements (e.g., from the output sensor 118); a reactance setting of the variable reactance section 120; and a model of the matching network 104.

The specific embodiment of the match network 104 in FIG. 1 (in which the reactance controller 122, the measurement section 124, and the damage detection component 126 are within the internal controller 119) may be beneficial for one or more reasons. For example, the internal controller 119 of the match network 104 may have access to internal parameters of the match network 104 that the external controller 107 (or other external controllers) does not have access to. As another example, the internal controller 119 is in closer proximity to the sensors 116, 118; thus, data from the sensors may be received and processed relatively quickly. In addition, the components of the internal controller 119 may be realized on the same printed circuit board or even the same chip (as a system on a chip); thus, very fast bus communications (without the need to translate to another communication protocol, such as a local area network protocol) may be carried out between the components of some embodiments of the internal controller 119.

In variations of the embodiment depicted in FIG. 1, it may be beneficial to distribute one or more of the components of the match network 104, so other configurations are certainly contemplated. For example, one or both of the input sensor 116 and output sensor 118 may be located outside of the match network 104. As another example, the input sensor 116 may reside within the generator 102 and the generator 102 may provide a signal indicative of electrical parameters at the output of the generator 102 to the measurement section 124. Moreover, one or more of the components of the internal controller 119 (e.g., one or more of the reactance controller 122, measurement section 124, or damage detection component 126 may be located apart from the match network 104.

For example, it is contemplated that one or more components of the damage detection component 126 may be located remotely from the match network 104 and may be coupled to the match network 104, the generator 102, or the external controller 107 by a network connection. In many instances, operators of plasma processing systems (such as the system depicted in FIG. 1) may prefer to utilize a centralized controller (such as the external controller 107) for convenience, and because the operators may prefer to have control over the logic and algorithms that are utilized in the damage detection component 126 or other components of the internal controller 119.

By way of further example, it should also be recognized that the components of the match network 104 are depicted as logical components and that the depicted components may be realized by common constructs (e.g., a common central processing unit and non-volatile memory) that are closely integrated, or the depicted components may be further distributed. For example, the functionality of the measurement section 124 may be distributed between the input sensor 116 and the output sensor 118 so that signals output from the input sensor 116 and/or output sensor 118 are digital signals that have been processed and digitalized in close connection with the sensors 116, 118, which enables the reactance controller 122 to directly receive processed signals from the sensors 116, 118. The specific examples of the distribution of the depicted functions are not intended to be limiting because it is certainly contemplated that various alternatives may be utilized depending upon the type of hardware that is selected and the extent to which software (e.g., embedded software) is utilized.

Figure 2:
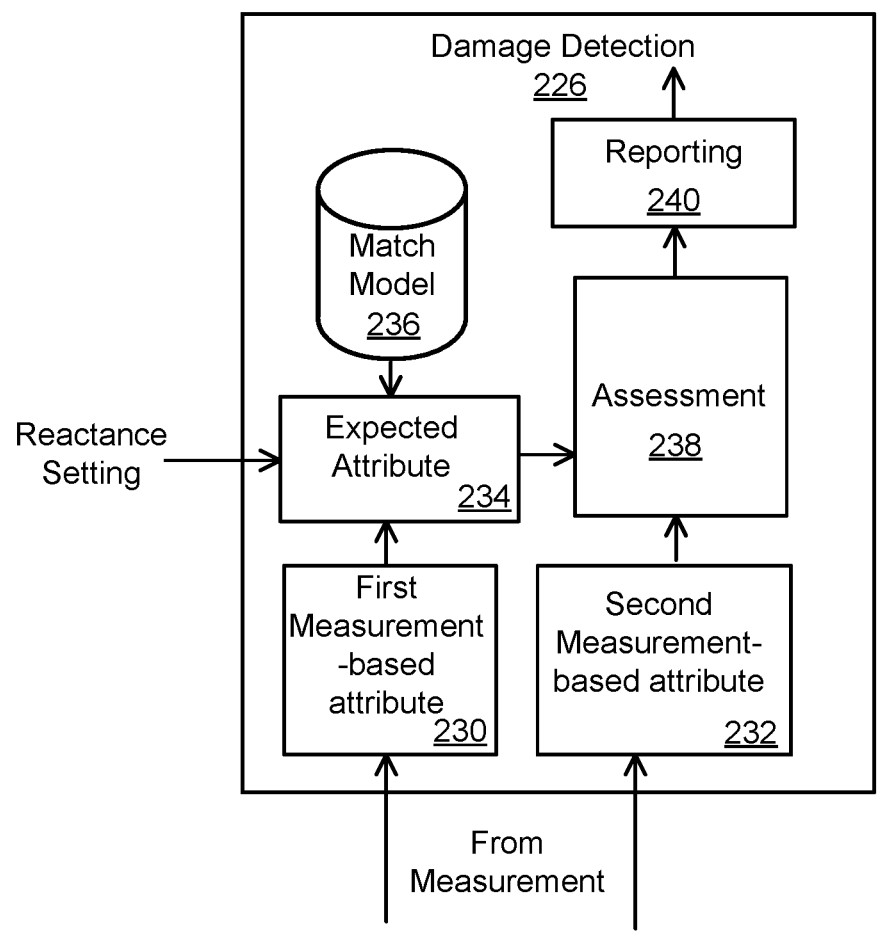
FIG. 2 is an exemplary implementation of the damage detection component depicted in FIG. 1.

Referring next to FIG. 2, shown is a block diagram depicting exemplary components of a damage detection component 226 that may be utilized to implement the damage detection component 126 depicted in FIG. 1. As shown, the damage detection component 226 includes a first-measurement-based-attribute component 230 and a second-measurement-based-attribute component 232. The first-measurement-based-attribute component 230 is disposed to receive measurements of one or more parameters at a first side of the match network 104, and in turn, the first-measurement-based-attribute component 230 is disposed to provide at least one measurement-based-attribute (indicative of an attribute at the first side of the match network 104) to an expected attribute component 234. The expected attribute component 234 is in communication with a match model 236 and an assessment component 238. The second-measurement-based-attribute component 232 is disposed to receive measurements of one or more parameters at a second side of the match network 104, and in turn, the second-measurement-based-attribute component 232 is disposed to provide at least one measurement-based-attribute (indicative of an attribute at the second side of the match network 104) to the assessment component 238.

Figure 3:
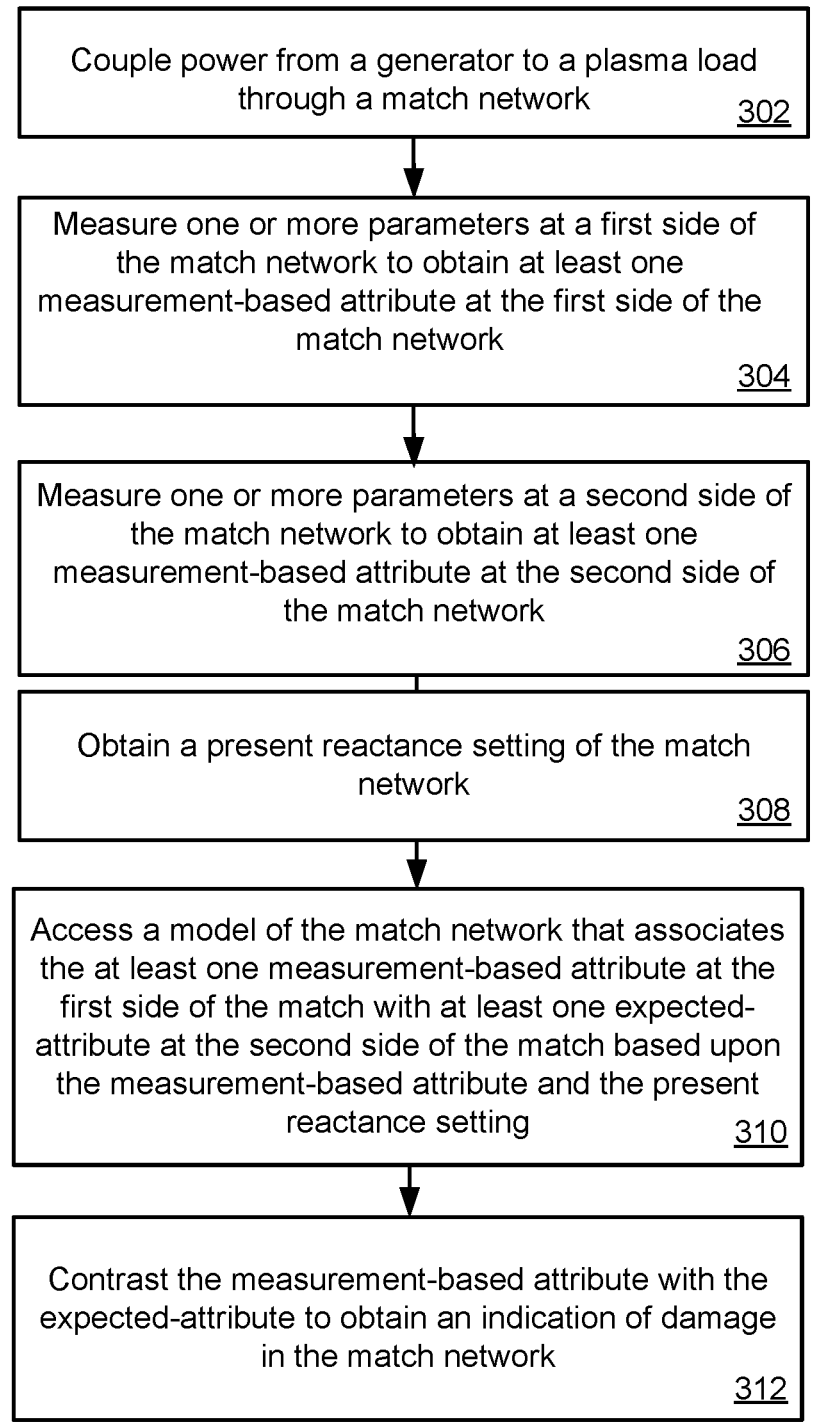
FIG. 3 is a flowchart depicting an exemplary method that may be traversed by embodiments disclosed herein.

While referring to FIG. 2, simultaneous reference is made to FIG. 3, which is a flowchart depicting a method that may be traversed in connection with embodiments herein. Although FIGS. 1 and 2 are referenced in connection with FIG. 3, it should be recognized that the method depicted in FIG. 3 is not limited to the depicted implementations of FIGS. 1 and 2.

As shown in FIG. 3, power from the generator 102 is coupled to the plasma load 106 through the match network 104 (Block 302). One or more parameters at the first side of the match network 104 are measured to obtain the at least one measurement-based-attribute at the first side of the match network (Block 304), and one or more parameters at the second side of the match network are measured to obtain at least one measurement-based-attribute at a second side of the match network 104 (Block 306). As discussed above, the measurements (at Blocks 304 and 306) may be made by the measurement component 124 in connection with the input sensor 116 and the output sensor 118.

The first side of the match network 104 may be the input 112 of the match network 104, and if the first side is the input 112, then the second side is the output 114. The first side may also be the output 114 of the match network 104, and if the first side is the output 114 of the match network 104, then the second side is the input 112 of the match network 104. In other words, the first side is one of either the input 112 or the output 114 of the match network 104, and the second side is an opposite side of the match network 104 from the first side. The term opposite here refers to the electrically opposite side where the input 112 and output 114 are on electrically opposite sides of the match network 104.

The one or more parameters measured at the first and second sides of the match network 104 (at Blocks 304 and 306) may include, without limitation, one or more of voltage, current, phase between the voltage and current, forward power, reflected power, phase between forward and reflected power, delivered power, and impedance; and the obtained measurement-based attributes at the first and second sides of the match network 104 (at Blocks 304 and 306) may include one or more of voltage, current, phase between the voltage and current, forward power, reflected power, phase between forward and reflected power, delivered power, phase, and impedance.

In some implementations, the at least one measurement-based attribute is derived from the one or more measured parameters. For example, the measured parameters may be forward and reflected power received at the first-measurement-based-attribute component 230 and/or the second-measurement-based-attribute component 232, and the at least one measurement-based attribute may be one or both of current and voltage. In these implementations, the current and voltage may be derived (e.g., calculated) by the first-measurement-based-attribute component 230 and/or the second-measurement-based-attribute component 232 from the measured forward and reflected power. As another example, the measured parameters may be voltage, current, and phase and the measurement-based attribute may be impedance. In these implementations, the first-measurement-based-attribute component 230 and/or the second-measurement-based-attribute component 232 may include logic (e.g., implemented by hardware or software in connection with hardware) to calculate the measurement-based-attribute based upon the measured parameters.

In other implementations, the at least one measurement-based attributes are the same as the one or more measured parameters. For example, the one or more measured parameters may be at least one of voltage and current and the at least one measurement-based attributes may be at least one of voltage and current. In these implementations, the first-measurement-based-attribute component 230 and/or the second-measurement-based-attribute component 232 need not include logic to convert from one parameter to another parameter. Regardless of whether the measurement-based attributes are derived (e.g., by calculations) or more directly measured, the first-measurement-based-attribute component 230 provides at least one measurement-based attribute (indicative of an attribute at the first side of the match network 104) to the expected attribute component 234 and the second-measurement-based-attribute component 232 provides at least one measurement-based attribute (indicative of an attribute at the second side of the match network 104) to the assessment component 238.

Referring again to FIG. 3, a present reactance setting of the match network 104 is obtained (Block 308)(e.g., from the reactance controller 122 or variable reactance section 120), and the present reactance setting is used by the expected attribute component 234 to access the match model 236. As discussed further herein, the match model 236 associates the at least one measurement-based attribute with at least one expected-attribute based upon the measurement-based attribute and the present reactance setting (Block 310). There are a variety of different ways the match network 104 may be characterized, but in general, the match model 236 enables one or more measurement-based attributes (e.g., voltage, current, impedance, reflected power, forward power, and delivered power) obtained from one side of the match network 104 to be used to obtain one or more expected-attributes (e.g., voltage, current, impedance, reflected power, forward power, and delivered power) at the other side of the match network. It should be recognized that the voltage, current, impedance, forward power, reflected power, and delivered power parameters used herein are generally complex numbers.

As one of ordinary skill in the art will appreciate, the match model 236 may include data that is generated based upon aspects of the input and output sensors 116, 118 and the variable reactance section 120. For example, the match model 236 may include both calibration data (obtained by calibrating the input and output sensors 116, 118) and characterization data that characterizes the variable reactance section 104. In some implementations, the data in the match model 236 is not readily disaggregated (to be identifiable as calibration data for each of several components of the match network 104), and instead, the data characterizes electrical aspects of the match network 104 as a whole.

Obtaining one or more expected-attributes at a second side of the match network 104 enables the assessment component 238 to contrast the measurement-based-attribute (indicative of the attribute at the second side of the match network 104) to the expected-attribute at the second side of the match network 104 to obtain an indication of damage in the match network 104 and/or operation of the match network that is outside of specifications (Block 312). In general, the expected-attribute is an indicator of an expected state (at the second side of the match network 104) that is expected based upon both of 1) characteristics of the match network 104 (at the present setting of the variable reactance section 120); and 2) the measurement-based attribute at the first side of the match network 104. The measurement-based attribute at the second side of the match network 104 is an indication of an actual state (based upon measurements obtained at the second side of the match network 104). As discussed above, the measurement-based attributes and the expected attributes may be complex numbers. But in many implementations, when contrasting the measurement-based attributes and the expected attributes, an absolute value of each the complex measurement-based attributes and the complex expected attributes may be obtained and then contrasted. As used herein, "contrasting" is intended to convey an assessment that evaluates one or more differences (e.g., between values or between qualities), and it should be recognized that contrasting includes any "comparisons" that explicitly or implicitly convey differences (e.g., between two compared values or between two compared qualities).

If the match network 104 is damaged and/or operating outside of specifications, the assessment component 238 may prompt a reporting portion 240 to provide an alarm to an operator via a display and/or audio transducer of the match network 104. In some implementations, the reporting portion 240 may send a signal to the external controller 107, and the external controller 107 may provide an alarm to an operator of the system. The signal from the reporting portion 240 may be sent automatically or may be sent in response to a query from the external controller 107. In some implementations, contrasting the measurement-based attribute with the expected-attribute may include obtaining a difference between the measurement-based attribute with the expected-attribute, and the difference may be applied to one or more thresholds. For example, if the difference exceeds a first threshold, the reporting portion 240 may provide the operator with a low-level warning. And if the difference exceeds a second threshold, a higher-level warning may be reported to prompt the operator to interrupt a processing cycle.

It is also contemplated that more than one measurement-based attribute may be contrasted with more than one expected-attribute. For example, the measurement-based attributes and the expected-attributes may include both voltage and current. In this example, a difference between a measurement-based voltage value and an expected voltage value may be obtained and a difference between a measurement-based current value and an expected current value may be obtained. By way of further example, an alarm is reported to a user only if both the voltage difference and the current difference each exceed a corresponding one or more thresholds. It is also contemplated that both a product of the measurement-based voltage and the measurement-based current may be obtained, and a product of the expected voltage value and the expected current value be obtained. Then, a difference between the products may be applied to one or more thresholds.

In some embodiments, the one or more thresholds are characterized across settings of the variable reactance section 120 due to uncertainties in measurements that are obtained (e.g., due to uncertainties in measurements from the input sensor 116 and/or output sensor 118) and/or uncertainties due to the data obtained from the match model 236 (e.g., due to imperfections in the match model). For example, each setting of the variable reactance section 120 may be associated with a potentially different threshold based upon the uncertainties. As another example, certain ranges of settings of the variable reactance section 120 may be associated with corresponding thresholds. Those of ordinary skill in the art will appreciate that the uncertainties, and hence, thresholds that are used may be a function of (potentially many) different aspects of the components of the match network 104 and the match model 236. Those of ordinary skill in the art will further appreciate that empirical data obtained in connection with a particular match network may be used to adjust the thresholds due to measurement uncertainties, and empirical data obtained in connection with a particular match model may be used to adjust the thresholds due to imperfections in a particular match model.

As another example of multiple thresholds, a threshold associated with an input impedance (of the match network 104) may be used in connection with another threshold that is contrasted with a difference between a measurement-based-attribute and an expected-attribute. For example, an alarm may be initiated if a measured output-sensor voltage (the measurement-based-attribute) differs by greater than 5% of an expected match output voltage (the expected-attribute) and if an input impedance of match network is within 1.05 VSWR (voltage standing wave ratio) of a desired input impedance of 50 ohms.

Figure 4:
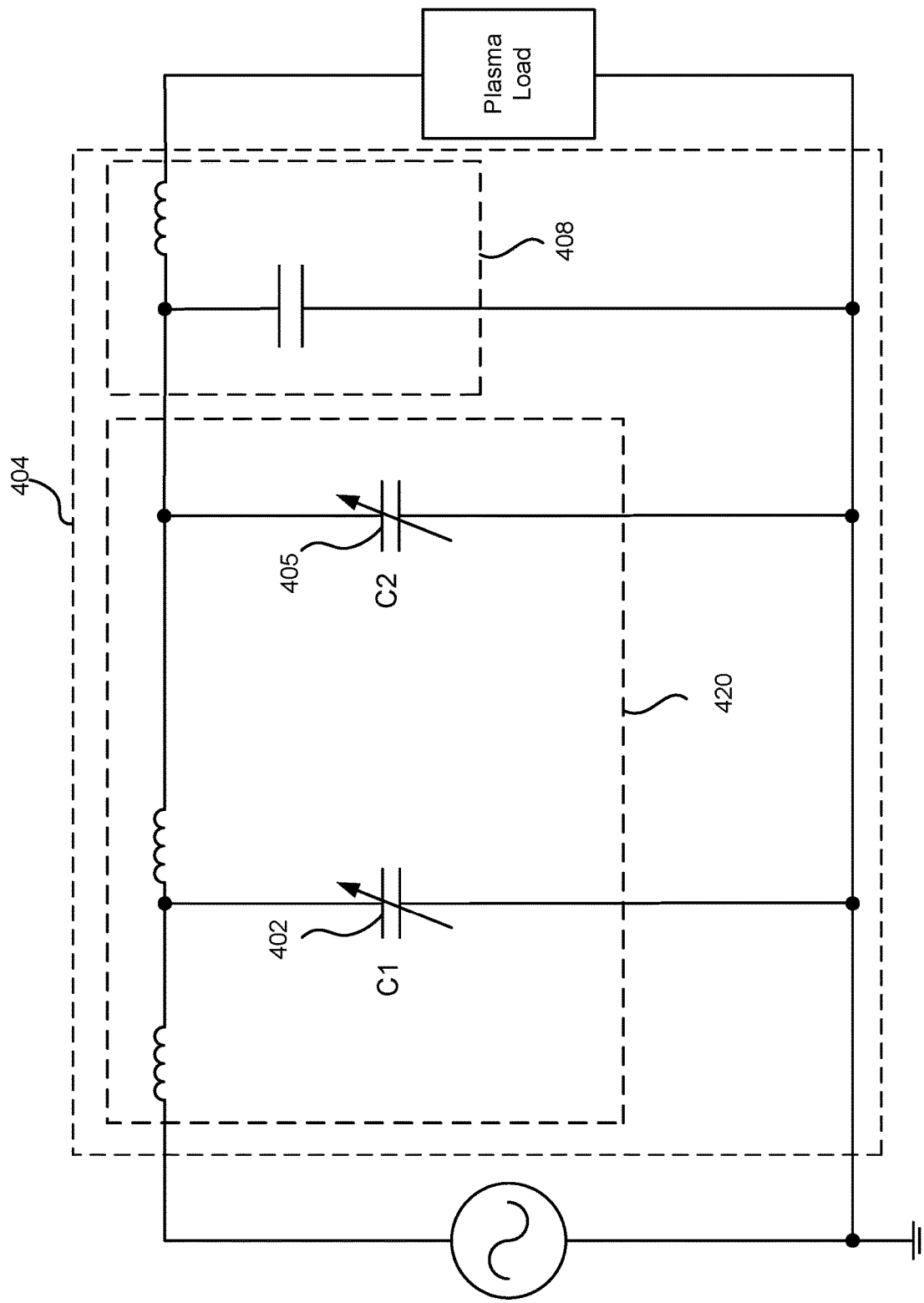
FIG. 4 is an exemplary implementation of portions of the match network depicted in FIG. 1.

Referring next to FIG. 4, shown are aspects of an exemplary match network 404 that may be used to realize the match networks 104, 204 described with reference to FIGS. 1 and 2. As shown, the match network 404 includes a variable reactance section 420 that includes at least two variable reactance elements, such as variable capacitors 402 (C1) and 405 (C2). Each of the variable capacitors 402 and 405 can be realized by typical vacuum variable capacitors or a plurality of switched capacitors. As shown, the variable reactance section 420 can be arranged with a fixed reactance section 408, for instance, comprising, a capacitor and an inductor.

As those of ordinary skill in the art will appreciate, the match model 236 may be affected by the fixed reactance section 408 and other fixed components of the match network 420, but for simplicity, the match model 236 is described as, at least, defining or characterizing the variable reactance section section 420 because the variable reactance section 420 largely affects how parameters at the input of the match network 404 vary relative to parameters at the output of the match network 404.

Figure 5:
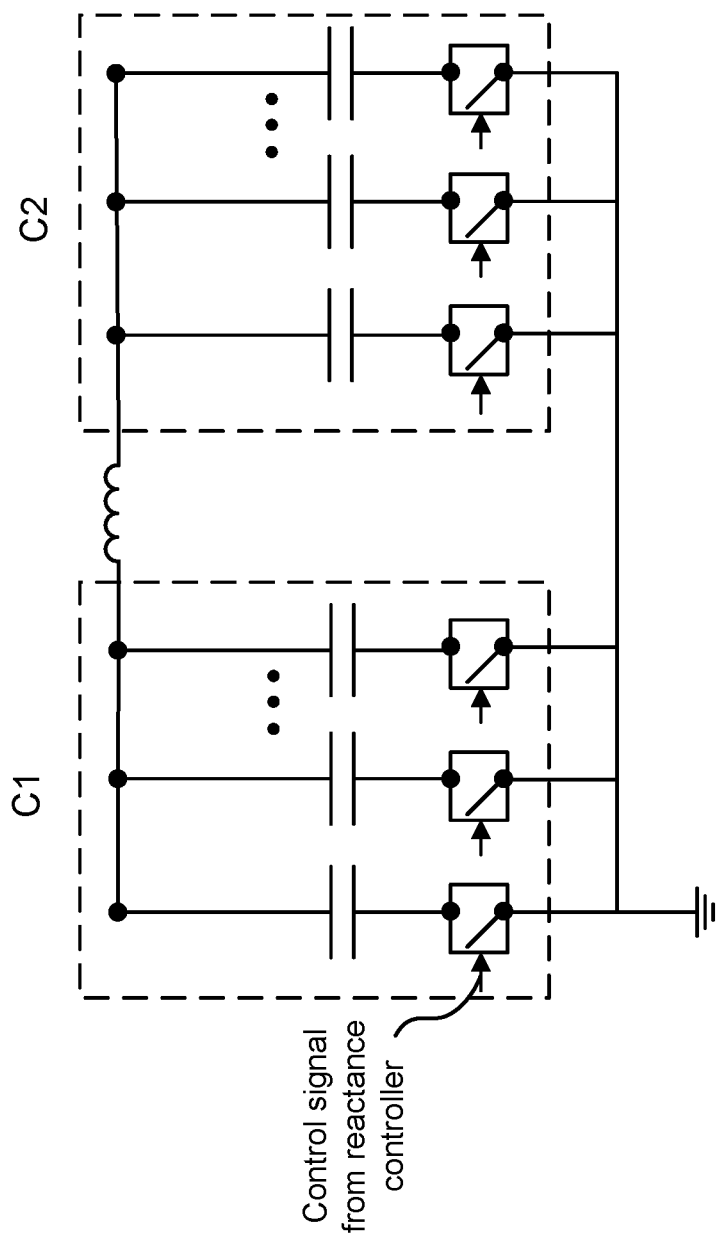
FIG. 5 is a schematic representation of an exemplary implementation of a reactance section of the match network depicted in FIG. 4.

Referring to FIG. 5, shown is an exemplary implementation of two capacitors C1 and C2 that may be utilized to realize the variable capacitors 402, 405 depicted in FIG. 4. As shown, each of the capacitors C1 and C2 may include a plurality of switched capacitors switched in and out of utilization. By switching combinations of the capacitors in and out of use, the capacitance of the variable capacitors C1 and C2 may be varied.

While two variable capacitors C1 and C2 are shown in FIG. 4, in other embodiments, one variable capacitor or more than two variable capacitors can be used. One or more inductors may also be arranged before or between the variable capacitors, where the illustrated configuration is just one of many implementations. Moreover, the aspects of the present disclosure are certainly not limited by switched capacitor implementations, but switched capacitor implementations may be more prone to continue operating even with some damage, and prior to the present disclosure, there was no known way to easily detect the damage. As previously discussed, the damage may cause power loss, resulting in lower power being applied into a process chamber, which may cause a process shift and damage to a work piece that is being processed.

Figure 6:
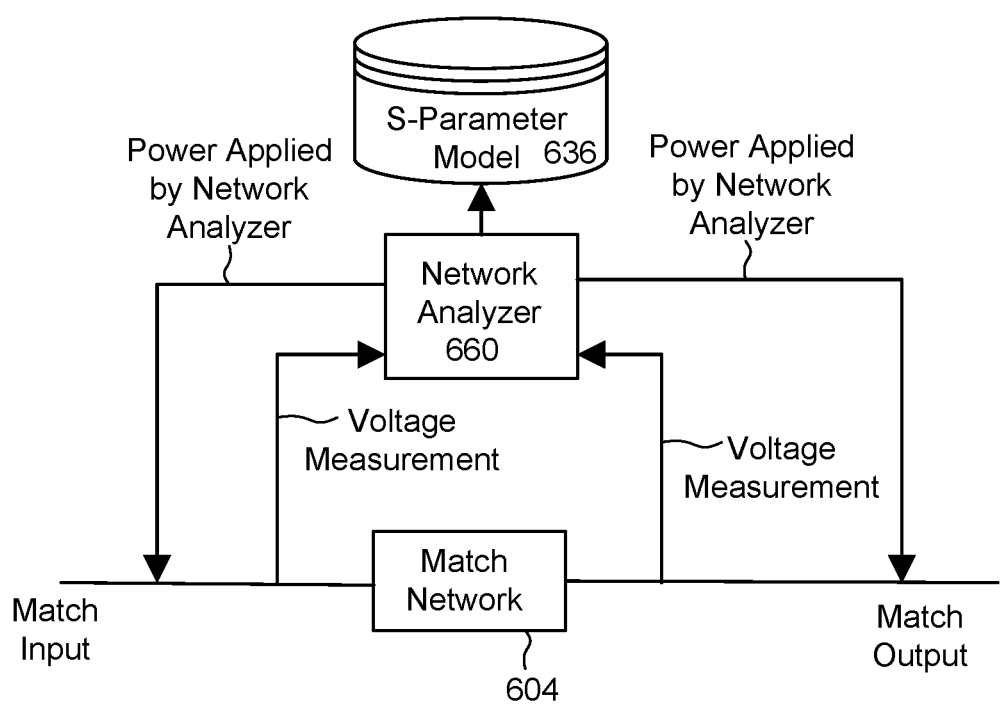
FIG. 6 is a block diagram depicting components that may be utilized to generate models of match networks.

Referring next to FIG. 6, shown is an exemplary approach to generating a model of a match network 604. In general, the network analyzer 660 is configured to characterize the match network 604 in the form of a scattering-parameters ("s-parameters") model. As shown, a network analyzer 660 may be coupled to apply power to the input and output of the match network 604 and receive voltage measurements in response.

More specifically, to characterize the match network 604 at a particular frequency and a particular match setting, the network analyzer 660 generates a signal at the particular frequency (e.g., 13.56 MHz) that is applied to the two ports of the match network 604 while the match network 604 is set to the particular one of a plurality of match settings, which may be established by a particular combination of a setting of C1 and a setting of C2. From this signal, four specific s-parameters of the match network 604 are measured at the two ports of the match network; thus, four s-parameters are obtained for each combination of C1 and C2 at a particular frequency. These s-parameters are unitless, complex numbers that characterize aspects of the match network 604 itself.

Figure 7:
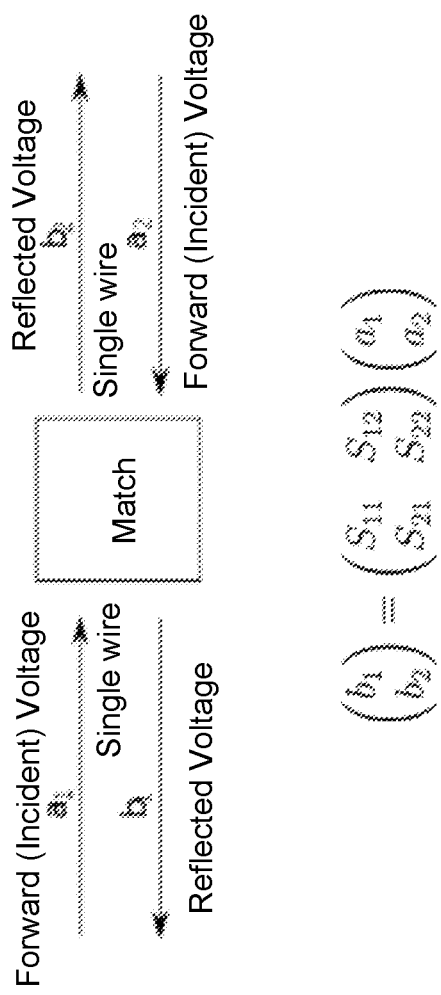
FIG. 7 depicts parameters, and relationships between the parameters, that may be obtained during generation of a model of a match network.

Referring to FIG. 7 shown is a depiction of voltage measurements that may be obtained by the network analyzer 660. As shown, $a_1$ represents forward voltage at port 1 ($a_1=V_1^+$), $a_2$ represents forward voltage at port 2 ($a_2=V_2^+$), $b_1$ represents reflected voltage at port 1 ($b_1=V_1^-$), and $b_2$ represents reflected voltage at port 2. Also shown in FIG. 7 is an s-parameter matrix depicting the relationship between the reflected, incident waves.

Expanding the matrices into equations gives:

$$b_1 = S_{11}a_1 + S_{12}a_2$$

and $$b_2 = S_{21}a_1 + S_{22}a_2$$

Each equation gives the relationship between the reflected and incident power waves at each of the match ports, 1 and 2, in terms of the match's individual s-parameters, $S_{11}$, $S_{12}$, $S_{21}$ and $S_{22}$. During characterization, port 2 may be terminated in a 50 ohm load, and $b_2$ may be totally absorbed making $a_2$ equal to zero. Therefore, defining the incident voltage waves as $a_1=V_1^+$ and $a_2=V_2^+$ with the reflected waves being $b_1=V_1^-$ and $b_2=V_2^-$, $$S_{11} = \frac{b_1}{a_1} = \frac{V_1^-}{V_1^+} \text{ and } S_{21} = \frac{b_2}{a_1} = \frac{V_2^-}{V_1^+}.$$

Similarly, if port 1 is terminated in the system impedance then $a_1$ becomes zero, giving $$S_{12} = \frac{b_1}{a_2} = \frac{V_1^-}{V_2^+} \text{ and } S_{22} = \frac{b_2}{a_2} = \frac{V_2^-}{V_2^+}$$

Figure 8:
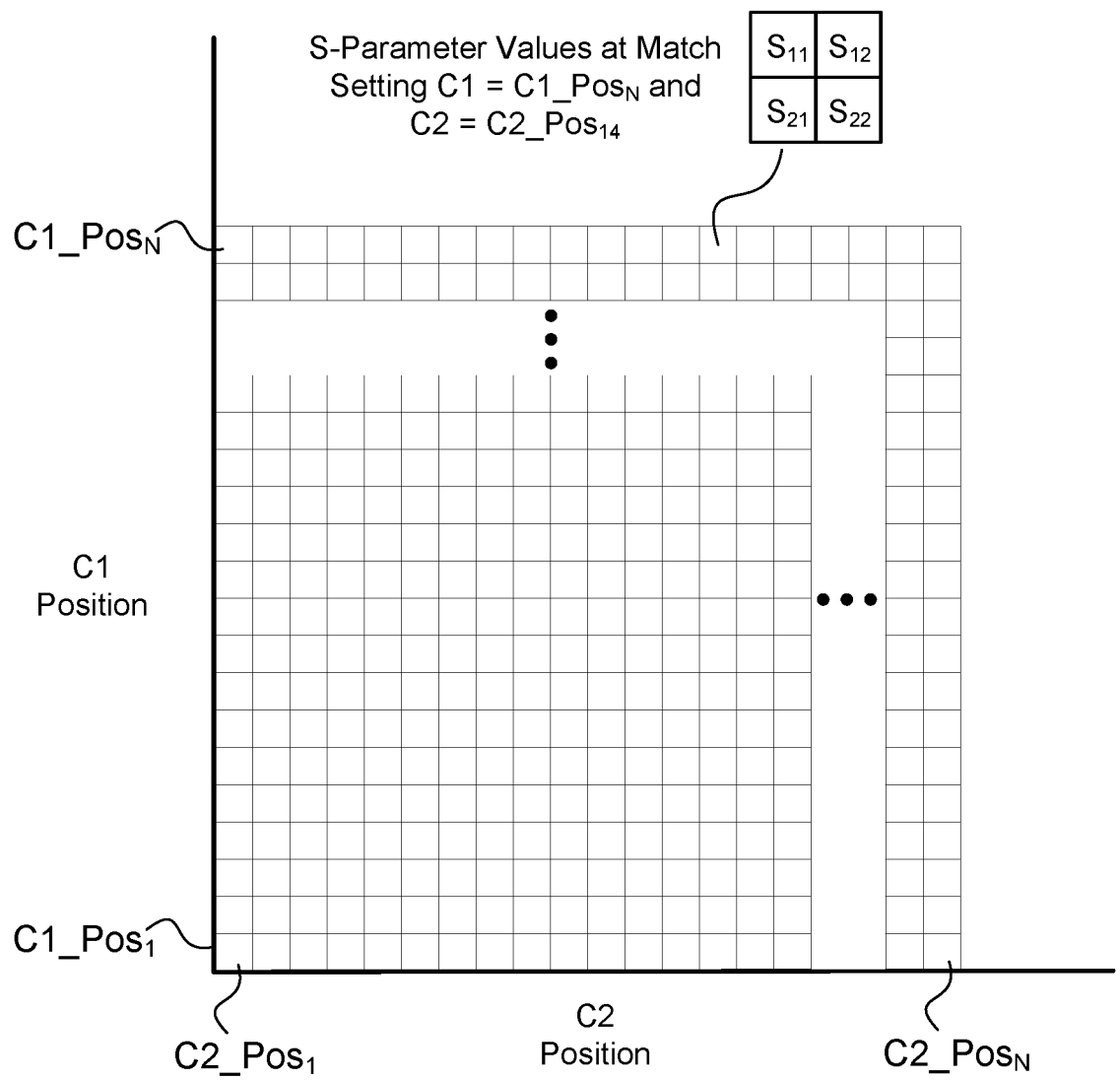
FIG. 8 depicts a matrix format that may be used to reference s-parameter values associated with a model of a match network.

As shown in FIG. 8, the s-parameter characterization data may include s-parameter values obtained for each combination of, at least, a portion of the available combinations of settings of C1 and C2. As a consequence, during operation, the match setting of the match network 604 (in terms of C1 and C2 settings) may be used to access s-parameters associated with the match setting. In turn, using the s-parameters, a measurement-based attribute at the first side of the match network may be used to obtain an expected-attribute at the second side of the match network 604. Those of ordinary skill in the art will readily appreciate, in view of this disclosure, that the s-parameter characterization described above relative to voltage may be performed relative to incident and reflected current, or incident and reflected power.

It should be recognized that when the s-parameter model 636 is generated, there may be some uncertainty in the accuracy of network analyzer measurements due to imperfections in operation of the network analyzer 660. For example, some network analyzers are designed to more optimally operate into a load that is 50 ohms. Thus, when the impedance seen by the network analyzer 604 changes while generating the s-parameter model 636, the resultant s-parameter model 636 itself may have imperfections (as discussed above with reference to FIG. 3). Those of ordinary skill in the art will appreciate, in view of this disclosure, that the s-parameter model may be adapted to mitigate against potential imperfections in the s-parameter model 636 to account for imperfections that may be inherent in network analyzers.

Figure 9:
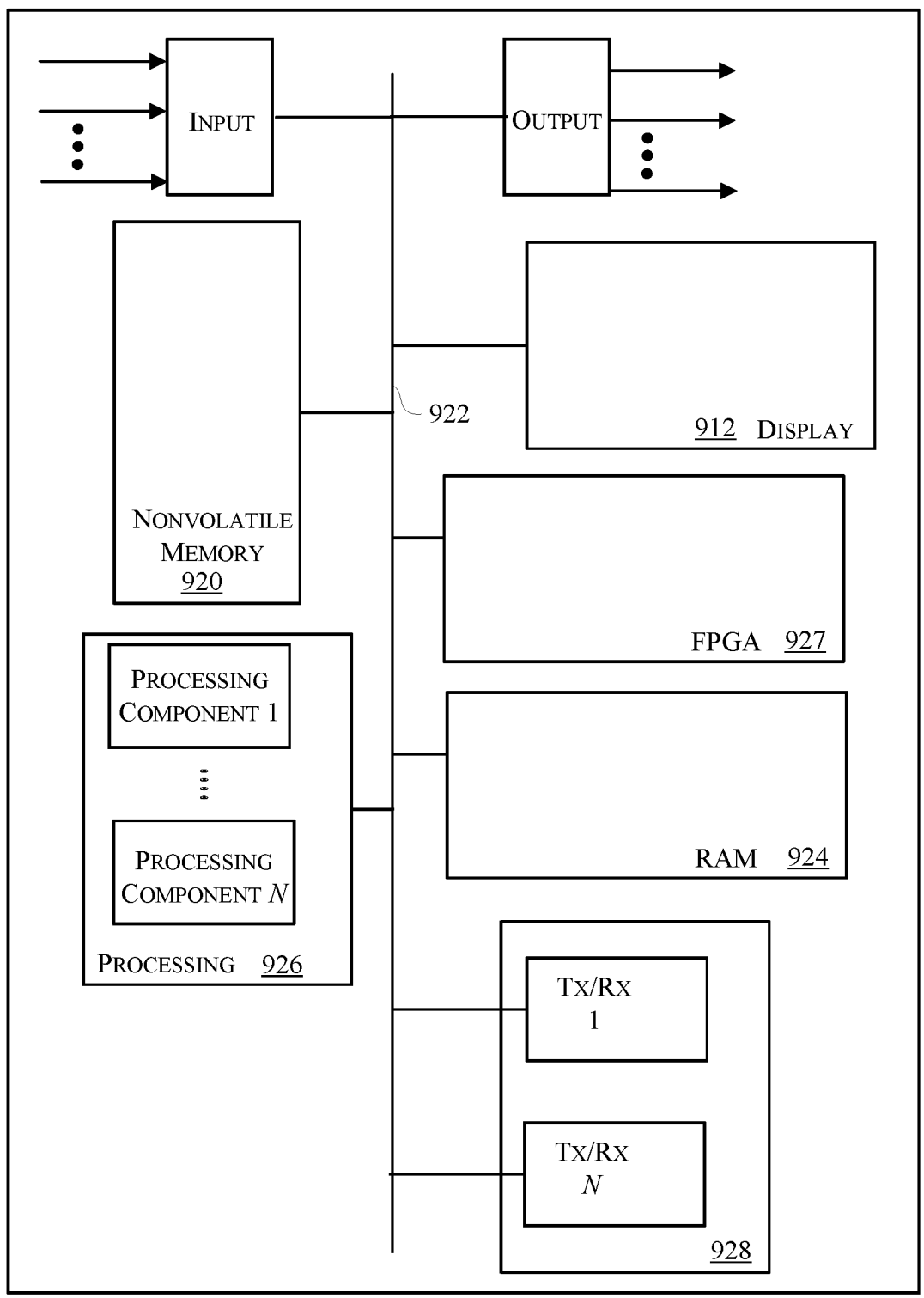
FIG. 9 is a block diagram depicting components that may be used to realize functional components described herein.

The methods described in connection with the embodiments disclosed herein may be embodied directly in hardware, in processor executable instructions encoded in non-transitory computer readable medium, or in a combination of the two. Referring to FIG. 9 for example, shown is a block diagram depicting physical components that may be utilized to realize components of the match networks 104, 604 and external controller 107 disclosed herein. As shown, in this embodiment a display portion 912 and nonvolatile memory 920 are coupled to a bus 922 that is also coupled to random access memory ("RAM") 924, a processing portion (which includes N processing components) 926, a field programmable gate array (FPGA) 927, and a transceiver component 928 that includes N transceivers. Although the components depicted in FIG. 9 represent physical components, FIG. 9 is not intended to be a detailed hardware diagram; thus, many of the components depicted in FIG. 9 may be realized by common constructs or distributed among additional physical components. Moreover, it is contemplated that other existing and yet-to-be developed physical components and architectures may be utilized to implement the functional components described with reference to FIG. 9.

This display 912 generally operates to provide a user interface for an operator of the match networks 104, 604, and in several implementations, the display 912 is realized by a touchscreen display. The display be used to realize, in part, the reporting section 240. In general, the nonvolatile memory 920 is non-transitory memory that functions to store (e.g., persistently store) data and machine readable (e.g., processor executable) code (including executable code that is associated with effectuating the methods described herein). In some embodiments for example, the nonvolatile memory 920 includes bootloader code, operating system code, file system code, and non-transitory processor-executable code to facilitate the execution of the methods described with reference to FIG. 3 described herein.

In many implementations, the nonvolatile memory 920 is realized by flash memory (e.g., NAND or ONENAND memory), but it is contemplated that other memory types may be utilized as well. Although it may be possible to execute the code from the nonvolatile memory 920, the executable code in the nonvolatile memory is typically loaded into RAM 924 and executed by one or more of the N processing components in the processing portion 926.

In operation, the N processing components in connection with RAM 924 may generally operate to execute the instructions stored in nonvolatile memory 920 to realize the functionality of the match networks 104, 604 including the damage detection component 226. For example, data for the match model 236 and non-transitory processor-executable instructions to effectuate the methods described with reference to FIG. 3 may be persistently stored in nonvolatile memory 920 and executed by the N processing components in connection with RAM 924. As one of ordinarily skill in the art will appreciate, the processing portion 926 may include a video processor, digital signal processor (DSP), graphics processing unit (GPU), and other processing components.

In addition, or in the alternative, the field programmable gate array (FPGA) 927 may be configured to effectuate one or more aspects of the methodologies described herein (e.g., the methods described with reference to FIG. 3). For example, non-transitory FPGA-configuration-instructions may be persistently stored in nonvolatile memory 920 and accessed by the FPGA 927 (e.g., during boot up) to configure the FPGA 927 to effectuate one or more functions the match networks 104, 604.

The input component may operate to receive signals (e.g., from the input sensor 116 and/or the output sensor 118) that are indicative of one or more parameters at the first and second sides of the match networks 104, 106. The signals received at the input component may include, for example, voltage, current, forward power, reflected power and impedance. The output component generally operates to provide one or more analog or digital signals to effectuate an operational aspect disclosed herein. For example, the output component may provide control signals to the capacitors C1 and C2 to control the setting of the match network 104, 604.

The depicted transceiver component 928 includes N transceiver chains, which may be used for communicating with external devices via wireless or wireline networks. Each of the N transceiver chains may represent a transceiver associated with a particular communication scheme (e.g., WiFi, Ethernet, Profibus, etc.). As disclosed herein with reference to FIG. 1 many functional components may be distributed across different network-connected locations, so one or more components depicted in FIG. 9 may be duplicated at the different locations (e.g., at the external controller 107), and the transceiver component may enable communication between the different locations.

It should be recognized that technologies other than those depicted in FIG. 9 may be utilized instead of, or in addition to, the technologies depicted in FIG. 9. For example, The various illustrative logical blocks, modules, and circuits described in connection with the embodiments disclosed herein may be implemented or performed with an application specific integrated circuit (ASIC), programmable logic device, discrete gate or transistor logic, discrete hardware components, or any combination thereof designed to perform the functions described herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system for assessing a match network, the system comprising:
non-volatile memory comprising a stored model that characterizes a variable reactance section of the match network in terms of s-parameters for each combination of, at least, a portion of available combinations of settings of switched capacitors; and
a controller comprising:
a reactance controller configured to control the setting of the switched capacitors; and
a damage detection component configured to:
obtain a present setting of the variable reactance section from the reactance controller;
access s-parameters of the stored model for the present setting;
obtain, using the s-parameters and at least one measurement-based-attribute at a first side of the match network, at least one expected-attribute at a second side of the match network; and
contrast the at least one measurement-based-attribute at the second side of the match network with the at least one expected-attribute to assess whether the match network is damaged.

2. The system of claim 1, wherein the controller is configured to:
obtain a measure of at least one of voltage or current at the second side of the match network to obtain the at least one measurement-based-attribute at the second side of the match network; and
obtain a measure of at least one of voltage or current at the first side of the match network to obtain the at least one measurement-based-attribute at the first side of the match network.

3. The system of claim 2, wherein:
the at least one measurement-based-attribute at the first side and the at least one measurement-based-attribute at the second side of the match network comprise a measured voltage value each, and the at least one expected-attribute comprises an expected voltage value.

4. The system of claim 2, wherein:
the at least one measurement-based-attribute at the first side and the at least one measurement-based-attribute at the second side of the match network comprise a measured current value each, and the at least one expected-attribute includes an expected current value.

5. The system of claim 2, wherein:
the at least one measurement-based-attribute at the first side and the at least one measurement-based-attribute at the second side of the match network include both a measured voltage value and a measured current value each and the at least one expected-attribute includes both an expected voltage value and an expected current value, wherein the controller is configured to contrast the at least one measurement-based-attribute at the second side of the match network with the at least one expected-attribute by:
determining a difference between the measured voltage value and the expected voltage value; and
determining a difference between the measured current value and the expected current value;
wherein at least one of a difference between the measured voltage value and the expected voltage value or a difference between the measured current value and the expected current value exceeds a corresponding threshold.

6. The system of claim 2, wherein the measurement-based-attribute at the second side of the match network includes an output impedance calculated based at least in part upon the voltage and current measured at an output of the match network;
wherein the measurement-based-attribute at the first side of the match network includes an input impedance calculated based at least in part upon the voltage or current values;
wherein the expected-attribute includes an expected impedance at the output of the match network obtained from the present settings of the match network;
wherein the controller is configured to contrast the output impedance at the output of the match network with the expected impedance at the output of the match network to determine operational changes of the match network.

7. The system of claim 1, wherein the controller is configured to obtain the one or more parameters with a sensor located within the generator.

8. The system of claim 1, further comprising a plurality of outputs from the match network to a plurality of plasma loads.

9. A match system comprising:
a variable reactance section comprising a plurality of switched capacitors;
at least one first sensor to measure one or more first parameter values at a first side of the variable reactance section;
at least one second sensor to measure one or more second parameter values at a second side of the variable reactance section;
non-volatile memory comprising a stored model that characterizes the variable reactance section in terms of s-parameters for each combination of, at least, a portion of available combinations of settings of the switched capacitors; and
a controller comprising:
a reactance controller configured to control a setting of the variable reactance section;
a damage detection component configured to:
obtain a present setting of the variable reactance section from the reactance controller;
access s-parameters of the stored model for the present setting;
obtain, using the s-parameters and one or more of the first parameter values measured at the first side of the variable reactance section, at least one expected parameter value for the second side of the variable reactance section; and
contrast the one or more second parameters values with the at least one expected parameter value to assess whether the match system is damaged.

10. The match system of claim 9, wherein:
the at least one first sensor includes at least one of a voltage sensor or a current sensor at an input of the variable reactance section;
the at least one second sensor includes at least one of a voltage sensor or a current sensor at an output of the variable reactance section.

11. The match system of claim 9, wherein
the at least one first sensor includes a voltage sensor and a current sensor at a first side of the match system;
the at least one second sensor includes a voltage sensor and a current sensor at a second side of the match system; and
wherein the controller is configured to:
calculate an impedance at the second side of the match system based upon voltage and current measured at the second side of the match system;
calculate an impedance at the first side of the match system based upon voltage and current measured at the first side of the match system;
obtain an expected impedance at the second side of the match system and contrasting the expected impedance at the second side of the match system with the calculated impedance at the second side of the match system to determine operational characteristics of the match system.

12. The match system of claim 9, wherein the at least one first sensor, the at least one second sensor, and the controller are one of: integrated with a common housing or distributed among two or more separate components.

13. A match system comprising:
a variable reactance section comprising a plurality of switched capacitors;
a first sensor to measure one or more first-parameters at a first side of the match system;
a second sensor to measure one or more second parameters at a second side of the match system;

a non-transitory computer-readable medium comprising:
a model that characterizes the variable reactance section in terms of s-parameters for each combination of, at least, a portion of available combinations of settings of the switched capacitors; and
instructions stored thereon, for execution by a processor, the instructions including instructions to:
to create a reactance controller to control a setting of the match system;
measure one or more parameters at the first sensor to obtain at least one measurement-based-attribute at the first side of the match system;
measure one or more parameters at the second sensor to obtain at least one measurement-based-attribute at the second side of the match system;
obtain a present setting of the variable reactance section from the reactance controller;
accessing s-parameters of the stored model for the present setting;
obtain, using the s-parameters and the at least one measurement-based-attribute at the first side of the match system, at least one-expected-attribute at the second side of the match system; and
contrast the at least one measurement-based-attribute at the second side of the match system with the at least one expected-attribute to assess operational changes of the match system.

14. The match system of claim 13, wherein the instructions to measure one or more output-parameters include instructions to obtain at least one of voltage or current at an output of the match system, wherein the output of the match system comprises the second side of the match system; and the instructions to measure one or more input-parameters include instructions to obtain at least one of voltage or current at an input of the match system, wherein the input of the match system comprises the first side of the match system.

15. The match system of claim 14, wherein:
the at least one measurement-based-attribute includes a measured voltage value and the at least one expected-attribute includes an expected voltage value.

16. The match system of claim 14, wherein:
the at least one measurement-based-attribute includes a measured current value and the at least one expected-attribute includes an expected current value.

17. The match system of claim 14, wherein:
the at least one measurement-based-attribute includes both a measured voltage value and a measured current value and the at least one expected-attribute includes both an expected voltage value and an expected current value, wherein the instructions to contrast include instructions to:
determine a difference between the measured voltage value and the expected voltage value; and
determine a difference between the measured current value and the expected current value;
wherein at least one of a difference between the measured voltage value and the expected voltage value or a difference between the measured current value and the expected current value exceeds a corresponding threshold.

18. The match system of claim 14, wherein the at least one measurement-based-attribute includes an output impedance calculated based upon the voltage and current measured at the output of the match system;
wherein the at least one measurement-based-attribute includes an input impedance calculated based upon one or more measured input-parameter values;
wherein the expected-attribute includes an expected impedance at the output of the match system that is obtained by accessing a model using the input impedance and a present reactance setting of the match system, wherein the present setting comprises at least the present reactance setting;
wherein the instructions to contrast include instructions to contrast the output impedance at the output of the match system with the expected impedance at the output of the match system to assess whether the match system is at least one of damaged or operating outside of specifications.

19. The match system of claim 14, wherein the instructions to measure one or more output-parameters include instructions to obtain at least one of forward or reflect power at the output of the match system; and
the instructions to measure one or more input-parameters include instructions to obtain at least one of forward or reflect power at the input of the match system.

* * * * *